(12) United States Patent  (10) Patent No.: US 8,253,464 B2
Jain  (45) Date of Patent: Aug. 28, 2012

(54) MULTI-THRESHOLD COMPLEMENTARY METAL-OXIDE SEMICONDUCTOR MASTER SLAVE FLIP-FLOP

(75) Inventor: Abhishek Jain, Greater Noida (IN)

(73) Assignee: STMicroelectronics International N.V., Amsterdam (NL)

( * ) Notice: Subject to any disclaimer, the term of this patent is extended or adjusted under 35 U.S.C. 154(b) by 80 days.

(21) Appl. No.: 12/827,225

(22) Filed: Jun. 30, 2010

(65) Prior Publication Data

US 2011/0267125 A1 Nov. 3, 2011

(30) Foreign Application Priority Data

Apr. 30, 2010 (IN) .......................... 1037/DEL/2010

(51) Int. Cl.
*H03K 3/289* (2006.01)
*H03K 3/356* (2006.01)
(52) U.S. Cl. ......... 327/203; 327/200; 327/201; 327/202
(58) Field of Classification Search .................. 327/200, 327/202, 203
See application file for complete search history.

(56) References Cited

U.S. PATENT DOCUMENTS

| | | | |
|---|---|---|---|
| 6,870,412 B2 | 3/2005 | Cho | |
| 7,138,842 B2 | 11/2006 | Padhye et al. | |
| 7,248,090 B2 * | 7/2007 | Ramprasad | 327/202 |
| 7,453,300 B2 * | 11/2008 | Won et al. | 327/218 |
| 7,639,056 B2 | 12/2009 | Gururajarao et al. | |
| 2009/0066386 A1 | 3/2009 | Lee | |
| 2010/0001774 A1 | 1/2010 | Djaja et al. | |

OTHER PUBLICATIONS

Yuan, J., et al., "New Single-Clock CMOS Latches and Flipflops With Improved Speed and Power Savings", IEEE Journal of Solid-State Circuits, vol. 32, No. 1, Jan. 1997, pp. 62-69.
Shigematsu, S., et al., "A 1-V High-Speed MTCMOS Circuit Scheme for Power-Down Application Circuits", IEEE Journal of Solid-State Circuits, vol. 32, No. 6, Jun. 1997, pp. 861-869.

* cited by examiner

*Primary Examiner* — John Poos
(74) *Attorney, Agent, or Firm* — Hogan Lovells US LLP

(57) ABSTRACT

A multi-threshold complementary metal-oxide semiconductor technology (MTCMOS technology) master slave flip-flop with a single clock signal includes a master storage element configured to store an input data in response to a clock signal transition and a slave storage element configured to receive data from the master storage element and to output the received data in response to an opposite clock signal transition. The master storage element includes low threshold voltage transistors, the slave storage element includes high threshold voltage transistors, and the master and the slave storage elements are provided with a single clock signal.

21 Claims, 6 Drawing Sheets

MULTI-THRESHOLD COMPLEMENTARY METAL-OXIDE SEMICONDUCTOR MASTER SLAVE FLIP-FLOP

RELATED APPLICATION

The present application claims priority of Indian Patent Application No. 1037/DEL/2010 filed Apr. 30, 2010, which is incorporated herein in its entirety by this reference.

FIELD OF THE INVENTION

The present invention relates to the field of semiconductor technology. In particular, the present invention relates to a multi-threshold complementary metal-oxide semiconductor technology (MTCMOS technology). Still more in particular, the present invention relates to a MTCMOS master slave flip-flop with a single clock signal.

BACKGROUND OF THE RELATED ART

A multi-threshold complementary metal-oxide semiconductor technology (MTCMOS technology) is employed in the field of integrated circuits for reducing a leakage current and/or for improving an operating speed. In a chip, the operation speed of particular circuit elements can be increased by realizing related transistors with low threshold voltages. Similarly, by implementing some circuit elements with transistors having a high threshold voltage, the leakage current of the circuit elements in a non-conducting state is reduced.

However, employing the MTCMOS technology in an integrated circuit always results in a trade-off between operation speed and leakage current. For instance, when increasing the threshold voltage of a transistor (resulting in a reduced leakage current), the operating speed of the transistor decreases, limiting the circuit performance. A similar trade-off also applies for transistors with a low threshold voltage causing the problem of a higher leakage current.

A different approach for reducing the leakage current teaches to cut off circuit elements from the power supply when they are not needed. However, a cut off power supply will result in a loss of information on an internal operating state. In particular, memory elements such as latches, flip-flops and other storage circuit elements depend on externally supplied power as the internal operational state can only be retained with an always-on power supply. Accordingly, in many circuit elements, state retention is necessary for recovering a circuit operation after a period with a cut off power supply.

Mobile devices depend heavily on an efficient use of the supplied power. Nevertheless, a reduction of leakage current is not limited to mobile devices. General purpose integrated circuits may also benefit from reduced leakage currents. The reduction of leakage currents becomes more important for integrated circuits of reduced size process technologies. Due to reduced transistor geometry, the amount of leakage currents increases and existing power reduction techniques are difficult to apply. In this respect, the MTCMOS technology may be employed in integrated circuits with decreased power consumption, for instance, in integrated circuits which are designed for portable uses, such as laptop computers, mobile phones, GPS, PDA, smart phones, MP3 players and the like. In particular, mobile devices are typically kept in an idle or a deep sleep mode for a considerable amount of time, consuming only leakage power.

An example of a master slave flip-flop circuit employing the MTCMOS technology is disclosed in U.S. Pat. No. 6,870,412 B2. In particular, this document discloses a master slave flip-flop circuit connected to a retention circuit. For reducing the power consumption in a sleep mode, inverter elements affecting the operational speed are implemented using transistors with a low threshold voltage. Additionally, said transistors are connected to a virtual ground terminal, which can be disconnected from ground potential for preventing a leakage current from flowing to ground in a sleep state. Further, the data from the flip-flop can be retained in the retention circuit. Circuit elements connecting the retention circuit comprise high-threshold voltage transistor, which prevents leakage currents in the sleep mode.

Another example of a master slave flip-flop circuit employing the MTCMOS technology is disclosed in "A 1-V High-Speed MTCMOS Circuit Scheme for Power-Down Application Circuits" by Shigematsu, Satoshi et. al. IEEE Journal of Solid-State Circuits, Vol. 32, No. 6, June 1997. For reducing the power consumption in sleep mode, the transistors of the master slave flip-flop are implemented as low-threshold voltage transistors connected to a virtual ground line. By disconnecting the virtual ground line from ground potential, the leakage current of transistors included in the master slave flip-flop circuit can be reduced. Moreover, a first retention circuit for the state of the master slave flip-flop and a second retention circuit for the clock signal are provided allowing the recovery of the operational state. The circuit elements of the retention circuits are realized using transistors with a low threshold voltage.

A further example of a master slave flip-flop circuit implemented using the MTCMOS technology is disclosed in U.S. Pat. No. 7,138,842 B2. The disclosed circuit has a master slave latch structure further comprising a retention latch connected for receiving data from the slave latch and for inputting data to the master latch. In particular, the master and slave latch includes inverters that can be disconnected from the power supply. Further, the inverters of the retention latch are realized as low-leakage devices, namely transistors with a high threshold voltage whereas the inverters included in the master slave flip-flop use low threshold voltage transistors.

An example of an integrated circuit comprising a master latch and a slave latch using the MTCMOS technology is disclosed in WO 2006/127888 A2. In normal operation mode, data from the master latch is input and stored in the slave latch. In the standby mode, the master latch is cut off from the power supply, whereas the slave latch continues to receive power in order to retain the input data. In order to decrease the leakage current, the implementation of the transistors in the integrated circuit realizes the transistors in two active regions in the silicon substrate, a first active region having a first type ion implantation and a second active region having a second type ion implantation.

Another example of a master slave flip-flop integrated circuit employing the MTCMOS technology is disclosed in US 2009/0066386 A1. In the disclosed master slave flip flop structure, the master latch and the slave latch are connected to different grounds. In particular, the slave latch is connected to real ground, whereas the master latch is connected to a virtual ground which can be disconnected by a high-threshold voltage transistor from ground potential. All other switching elements are provided as low-threshold voltage transistors.

An example of a master slave flip-flop integrated circuit employing the MTCMOS technology is disclosed in US 2010/0001774 A1. The disclosed master slave flip-flop structure comprises a master latch which also realizes as a retention circuit. In particular, the retention circuit in the master latch is implemented using high-threshold voltage transistors, whereas the master latch further comprises low-threshold voltage transistors. The slave latch is implemented using low-threshold voltage transistors. In a sleep mode, the power supply is cut off from all circuit elements except for the circuit elements forming the retention circuit. Accordingly, the leakage current can be reduced in the sleep mode.

All of the described integrated circuits focus on a reduction of leakage currents in a sleep mode. However, power losses are not only a problem in a sleep mode but also occur during operation and are called dynamic power losses. Specifically, when changing an operating state in a master slave flip-flop, the switching operation triggered by a clocking pulse results in a switching current, which is usually referred to as dynamic power consumption.

Consequently, one of the main problems concerning the above described master slave flip-flop integrated circuits relates to the dynamic power consumption of flip-flop circuits. In particular, the MTCMOS technology is employed for reducing leakage current in a sleep mode by preventing leaking current in circuit elements operating in the sleep state but does not contribute towards a reduced power consumption in the operating state.

An example for reducing the power consumption of CMOS latches and of flip-flops is disclosed by "New Single-Clock CMOS Latches and Flipflops with Improved Speed and Power savings", Yuan, Jiren and Svensson, Christer, IEEE Journal of Solid-State Circuits, Vol. 21, No. 1, January 1997. In order to face the demands for high speed and low power consumption, static differential latches and static flip-flops are disclosed, minimizing the clock load by reducing the number of clocked transistors. In particular, a static ratio-insensitive differential p-latch and a static ratio-insensitive differential n-latch are disclosed, which are provided with only a single clock signal. However, the static ratio-insensitive differential n-latch is slower than other static differential n-latches. Accordingly, the disclosed static flip-flops combine, for instance, the static ratio-insensitive differential p-latch with faster static differential n-latches rather than a static ratio-insensitive differential n-latch in order to achieve an improved operating speed.

Given these problems with the existing technology, it would be advantageous to provide an integrated circuit that provides a master slave flip-flop circuit employing the MTCMOS technology also reducing its dynamic power consumption in the operating state.

SUMMARY OF THE INVENTION

The present invention exploits the fact of reducing the dynamic power consumption of a MTCMOS master slave flip-flop due to a decreased clocking load. By decreasing the number of clocking transistors and by providing the MTCMOS master slave flip-flop with a single clock signal, the dynamic power consumption can be reduced.

Accordingly, a multi-threshold complementary metal-oxide semiconductor, MTCMOS, master slave flip-flop is provided, comprising a master storage element configured to store an input data in response to a clock signal transition, a slave storage element configured to receive data from the master storage element and to output the received data in response to an opposite clock signal transition, wherein the master storage element comprises low threshold voltage transistors and the slave storage element comprises high threshold voltage transistors, and wherein the master and the slave storage elements are provided with a single clock signal.

BRIEF DESCRIPTION OF THE DRAWINGS

The accompanying drawings are incorporated into and form a part of a specification to illustrate several embodiments of the present invention. These drawings, together with the description, serve to explain the principles of the invention. The drawings are merely for the purpose of illustrating preferred and alternative examples of how the invention can be made and used and are not to be construed as limiting the invention to only the illustrated and described embodiments. Further features and advantages will become apparent from the following and more particular description of the various embodiments of the invention, as illustrated in the accompanying drawings, in which like reference numbers refer to like elements and wherein.

DETAILED DESCRIPTION OF PREFERRED EMBODIMENTS

Figure 1:
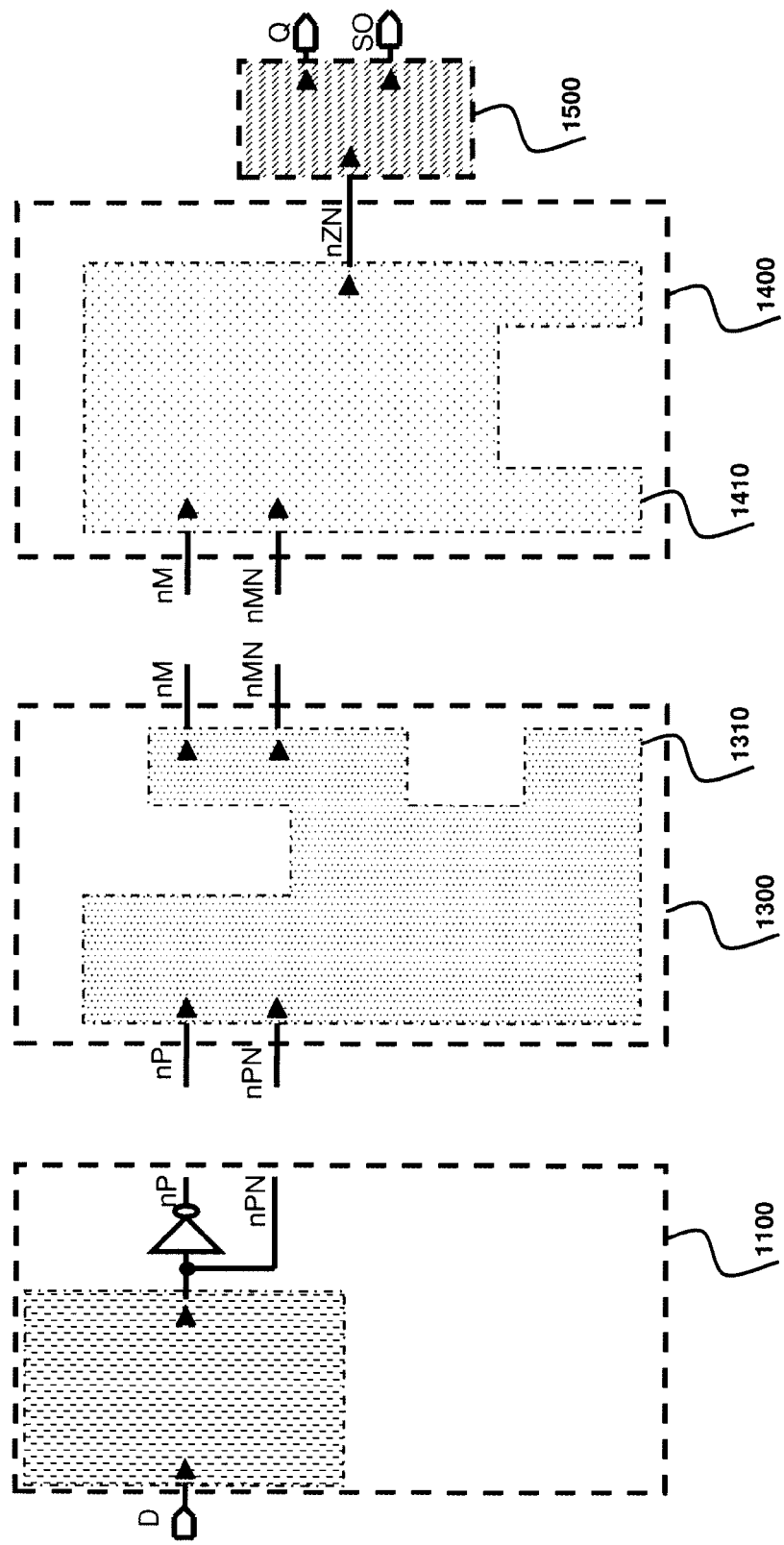
FIG. 1 shows a schematic block diagram of a master slave flip-flop according to the present invention.

Referring to the drawings, FIG. 1 shows a schematic block diagram of a master slave flip-flop according to an embodiment of the present invention.

The master slave flip-flop, as shown in FIG. 1, comprises a master storage element 1300 and a slave storage element 1400. Further, the master slave flip-flop may further comprise an input stage 1100 and an output stage 1500.

The master storage element 1300 comprises a first differential latch 1310 with an input including differential nodes nP and the inverted node nPN. These nodes are used for receiving input data to be stored by the first differential latch 1310. The master storage element 1300 may act as a memory for storing a data value provided via the input upon receiving a predefined clock transition signal. The master storage element also has an output, including differential nodes nM and the inverted node nMN for outputting stored input data to, for instance, the slave storage element 1400.

The slave storage element 1400 also has an input including differential nodes nM and the inverted node nMN for receiving data from, for instance, the master storage element 1300. The slave storage element 1400 may act as a memory for storing a data value provided via the input upon receiving an opposite clock transition signal. The received data is inputted into a second differential latch 1410, capable of storing the received input data. The stored input data is further outputted to an output which may be differential nodes or the node nZN as shown in FIG. 1.

Although there is no connection shown between the master storage element 1300 and the slave storage element 1400 in FIG. 1, a connection is implied by two nodes with a same name. Moreover, all nodes with a same name may be considered connected so that electrical signals can propagate without restriction. This manner of representation is used in order to maintain easily comprehensible drawings.

In FIG. 1, the input stage 1100 and the output stage 1500 are also shown. The input stage 1100 may receive data from a terminal D. The received data may then be provided to an input stage control means 1110. The input stage control means 1110 adapt the input signal in response to a TE and/or a TI signal in such a way that it may be used for an input to a master storage element 1300. Thereafter, the input signal is converted into a differential signal for output at the differential nodes nP and the inverted node nPN. The signal at the nodes nP and nPN from the input stage 1100 may be provided to the master storage element as an input.

The output stage 1500 may receive an output signal from the slave storage element 1400 for converting the received data corresponding an output Q and or output SO.

The master slave flip-flop of the invention, described for instance in FIG. 1, may also include retention functionality, as will become apparent in view of the following drawings.

Figure 2:
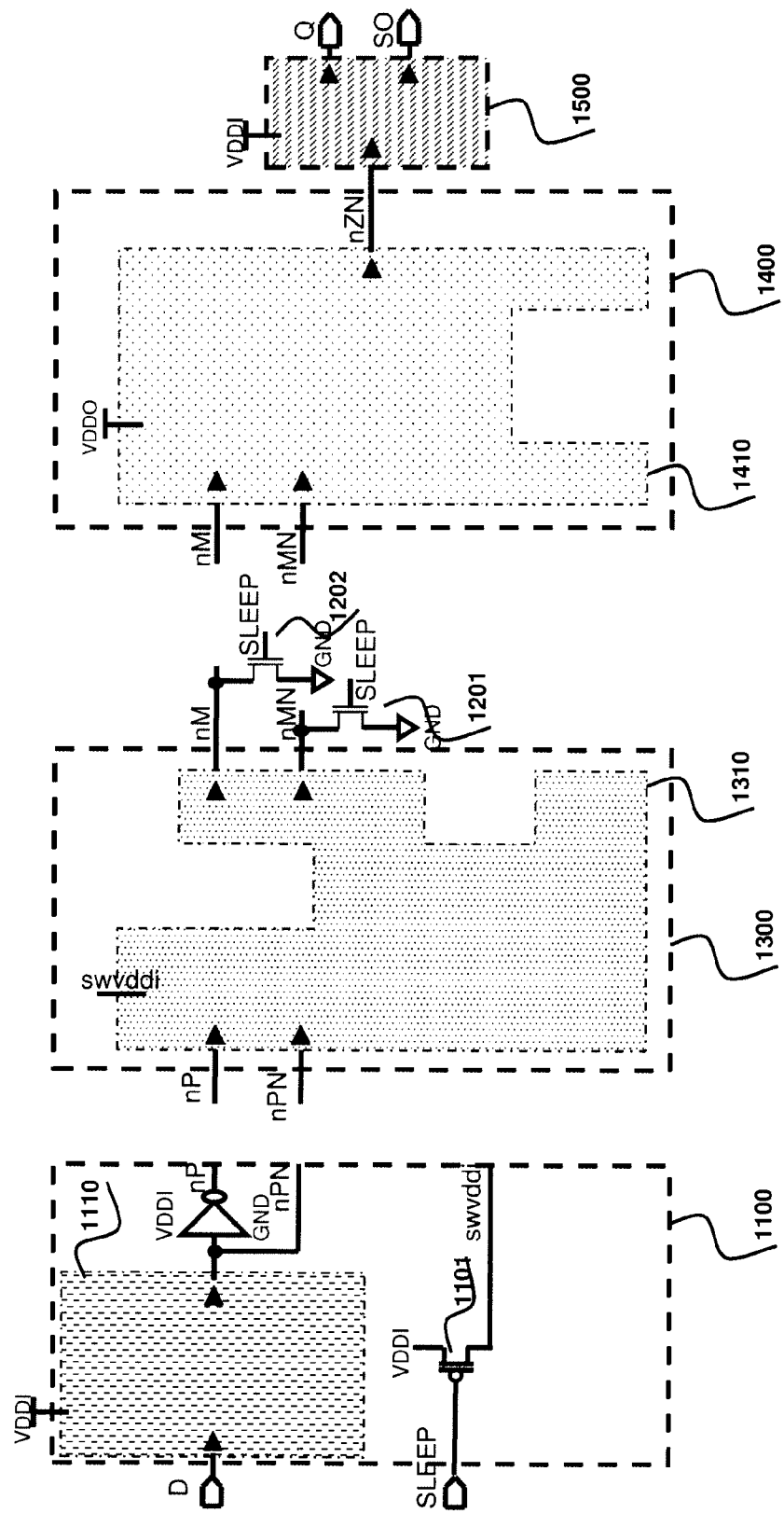
FIG. 2 illustrates a sleep mode of a master slave flip-flop according to an embodiment of the present invention.

FIG. 2 illustrates the sleep mode of a master slave flip-flop according to an embodiment of the present invention. For this purpose, FIG. 2 shows an example of connecting two different power supplies, an always-on power supply (VDDO) and an interruptible power supply (VDDI). As indicated by the names of the two power supplies, the always-on power supply (VDDO) may be operated irrespective of a sleep mode. The interruptible power supply (VDDI) may be stopped so that the connected circuit elements are cut off from the power. These interruptions may correspond to the sleep signal, a restart signal, a shutoff signal or other control signals relevant to the power supply of connected circuit elements.

As can be seen from FIG. 2, the slave storage element 1400 is connected to an always-on power supply (VDDO). Further, the master storage element 1300 is connected to an interruptible power supply (VDDI). In particular, the output of the interruptible power supply (VDDI) is controlled by a sleep signal (SLEEP) to generate an SWVDDI signal. This SWVDDI signal may be connected to the first differential latch 1310. Furthermore, the input stage control means 1110 may also be connected to the interruptible power supply as well as the output stage 1500.

In a normal operation mode, the master storage element 1300 and the slave storage element 1400 are provided with sufficient power for receiving data, for storing data and for outputting data. The same may also apply to the input stage 1100 as well as the output stage 1500.

In the sleep mode, the interruptible power supply (VDDI) is stopped. Accordingly, the voltage level provided by the interruptible power supply (VDDI) may slowly decrease. At the same time, the always-on power supply (VDDO) maintains outputting a voltage high enough for the slave storage element 1400 to operate. Accordingly, a data value stored in the slave storage element 1400 may retain the value even when the master storage element 1300 is not operational.

In this particular embodiment, the master storage element may be connected to the interruptible power supply through a first control means 1101. This first control means 1101 comprise a switching element which may interrupt the connection between the interruptible power supply (VDDI) and the master storage element 1300.

In particular, upon detecting a sleep signal provided at a terminal (SLEEP), the first control means 1101 may disconnect the interruptible power supply (VDDI) from the master storage element 1300, as indicated by the SWVDDI signal. By disconnecting the interruptible power supply (VDDI) from the master storage element 1300, a fast decrease of the voltage level supplied to the master storage element 1300 may be achieved. Accordingly, the first control means 1101 may immediately set the master storage element 1300 to a sleep state upon detecting a sleep signal. Performing an interruption of the power in correspondence with a sleep signal may enable performing the transition of the master storage element 1300 to a sleep mode in synchronization with other operations triggered by the sleep signal.

The second control means 1201, 1202 also responds upon detecting a change in the sleep signal. In particular, the second control means 1201, 1202 is configured to determine the value transmitted between the master storage element 1300 and the slave storage element 1400. Specifically, the connection between the first differential latch 1310 and the second differential latch 1410, via which the slave storage element 1400 receives data from the master storage element, is set by the second control means 1201, 1202 to a predetermined level. Thereby, the transmission of incorrect data can be prevented.

As the first control means 1101 and the second control means 1201, 1202 are triggered by the same sleep signal, the disabling of the voltage transmitted by the interruptible power supply to the master storage element is performed at the same time as the setting of the connection between the master storage element 1300 and the slave storage element 1400 to a predetermined level.

In other words, the sleep signal controls the operation of the master storage element and triggers a state change in the master storage element 1300 without influencing connected circuit elements, namely, without destroying the data stored in the slave storage element 1400.

Figure 3:
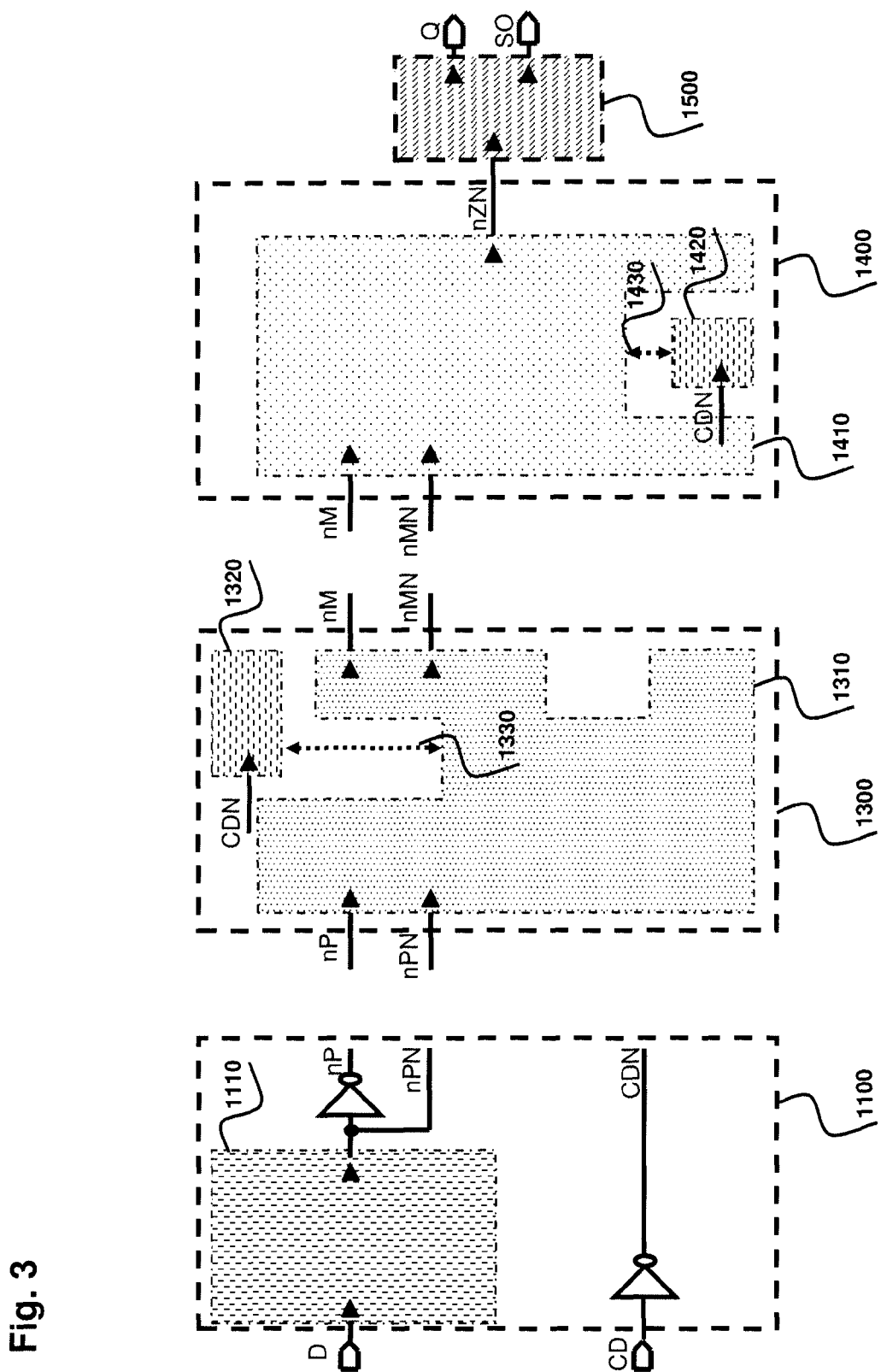
FIG. 3 illustrates a reset operation of a master slave flip-flop according to an embodiment of the present invention.

In FIG. 3, the reset operation of a master slave flip flop according to an embodiment of the present invention is illustrated.

As can be seen from FIG. 3, circuit elements are shown that interact with the first differential latch 1310 and the second differential latch 1410.

For reasons of clarity and comprehensibility, FIG. 3 omits the illustration of circuit elements which have been described with reference to FIG. 2. However, a combination of the described circuit elements may be advantageous in view of the object to be achieved by the present invention.

As shown in FIG. 3, a latching state resetting means 1320, 1420 may be comprised in the master storage element 1300 and the slave storage element 1400. In particular, the latching state resetting means 1320 included in the master storage element 1300 may interact with the first differential latch 1310 to control the state of the first differential latch 1310 by resetting the data stored in the first differential latch 1310 to an initial state (predefined state). The described interaction is indicated by a dotted line, connection 1330.

Latching state resetting means 1420 my also be included in the slave storage element 1400. In particular, for resetting the latching state of the second differential latch 1410 included in the slave storage element 1400, a latching state resetting means 1420 is included in the slave storage element 1400 interacting with the second differential latch 1410. The described interaction is indicated by a dotted line, connection 1330.

Latching state resetting means 1320, 1420 is provided for restoring the latching state to an initial state (predefined state). Moreover, upon detecting a clear data signal provided via terminal (CD), the latching state resetting means may control the first and second differential latch 1320, 1420 with which it interacts to override the stored value to a predefined latching state.

In particular, the interaction illustrated through dotted lines 1330 and 1430 may be realized by an electronically conducting connection or other techniques known in the art.

In the embodiment shown in FIG. 3, the latching state resetting means are configured to reset a latching state upon detecting an active low clear data signal. For this purpose, the input stage 1100 additionally includes an inverter converting an input clear data signal CD signal to an inverted clear data signal CDN signal which may be provided to the latching state resetting means 1320, 1420.

Figure 4:
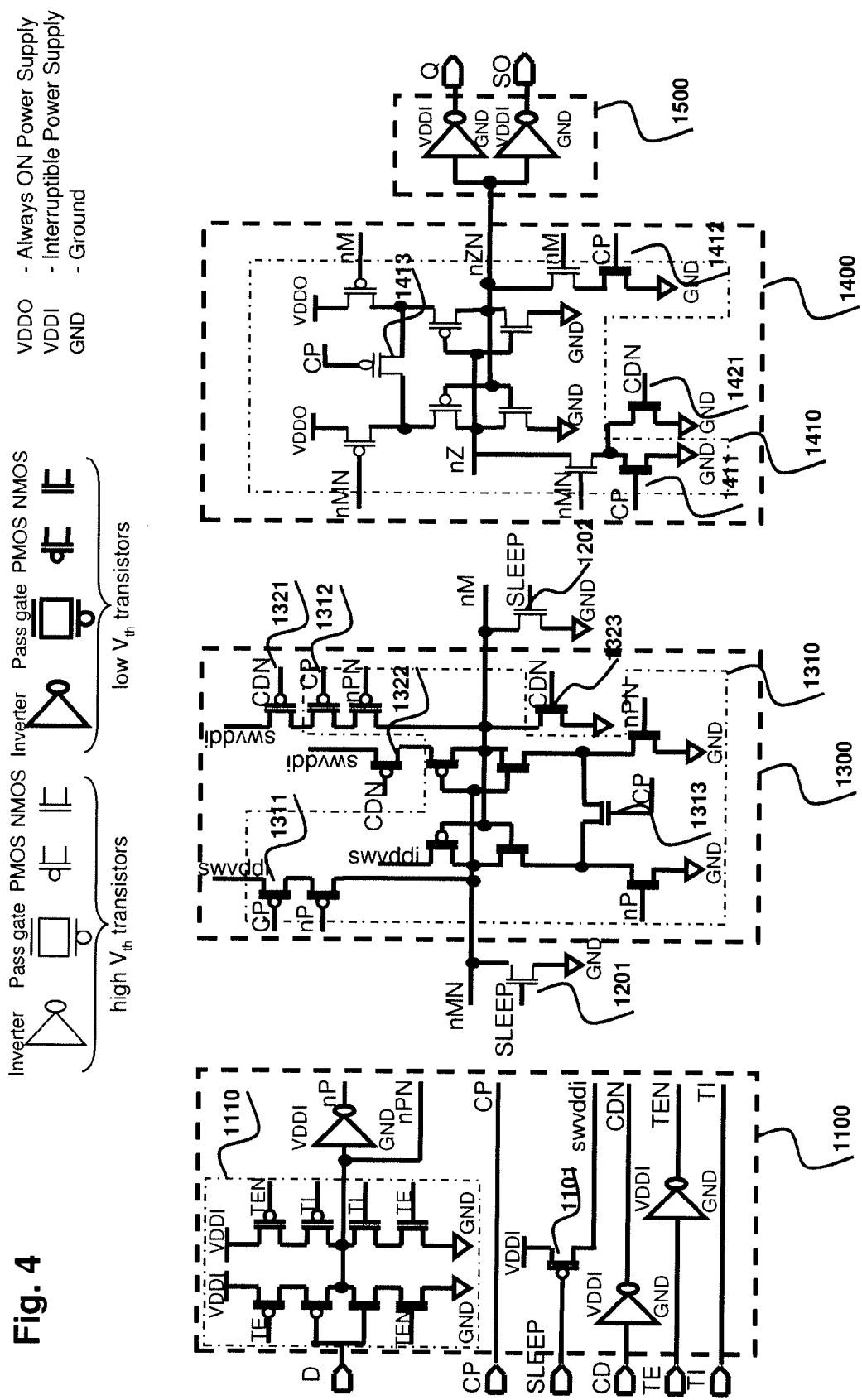
FIG. 4 shows an integrated circuit diagram of a master slave flip-flop according to an embodiment of the present invention.

FIG. 4 shows an integrated circuit diagram of a master slave flip-flop according to an embodiment of the present invention. In particular, the integrated circuit diagram illustrated in FIG. 4 provides the sleep operation as described with reference to FIG. 2 and the resetting operation as described with reference to FIG. 3. Accordingly, the description related to advantageous aspects regarding the two operations may also apply to the integrated circuit diagram illustrated in FIG. 4.

As shown in FIG. 4, the first differential latch 1310, included in the master storage element 1300, comprises low threshold voltage transistors. In particular, the first differential latch 1310 may be realized as a static ratio insensitive differential p-latch.

Accordingly, the first differential latch 1310 comprises three clocking transistors, 1311, 1312 and 1313. The first differential latch 1310 comprises at least one p-MOS clocking transistor, 1311, 1312 for triggering a change in the latching state when the clock signal changes to a low potential clock signal.

For instance, the clocking transistor 1311 included in the first differential latch 1310 is set to a conducting state by a clock signal transition to a low potential. Hence, the clock signal transition to a low potential allows current to flow from the interruptible power supply (VDDI) via connection SWVDDI to node nMN depending on the input signal at node nP.

In other words, when the clocking signal switches to a low potential, the data value stored in the first differential latch may be overwritten. The same also applies for clocking transistor 1312 also included in the first differential latch 1310. In particular, upon providing a low potential signal to the clocking transistor 1312, current may flow from connection SWVDDI to the node nN depending on the state of the input signal at node nPN.

The static ratio insensitive differential n-latch used in the master storage element 1300 further comprises a third clocking transistor 1313 for pre-charging, which is provided for speed improvements. As at least one of the signals at node nP and at node mPN may be assumed to have a high potential value, the respective terminal of the third clocking transistor 1313 has a conducting connection to ground. Accordingly, a high potential clocking signal applied to the third clocking transistor 1313 may also result in a low potential on the other terminal of the third clocking transistor 1313. Due to a low potential on both sides, the switching time of the differential latch may be reduced.

Further, a second differential latch 1410 included in the slave storage element 1400 is realized as a static ratio insensitive differential n-latch.

The static ratio insensitive differential n-latch may be understood to operate similarly to the static ratio insensitive differential p-latch. Yet the slave storage element 1410 receives and stores data in response to an opposite clock signal transition as the master storage element 1400.

Accordingly, the second differential latch 1410 includes clocking transistors of a second conductive type different from the first conductive type. In particular, the second differential latch may include an n-MOS clocking transistor 1411 and 1412 which allow a value change at node nZ upon detecting a clock signal transition to a high value. Depending on the input nMN and nM, the data stored in the second differential latch 1410 may change in response to a clock signal transition to a high potential.

Further, the second differential latch also comprises a third clocking transistor 1413 for pre-charging, in order to improve the switching speed of the second differential latch 1410. This third clocking transistor 1413 may be implemented as a p-MOS transistor sensitive to a low potential clock signal which is different from the high potential clocking signal for storing new data in the second differential latch 1410.

Further, the second differential latch 1410 comprises a retention latch configured to store a latching state of the second differential latch 1410 in a sleep period. As shown in FIG. 4, the retention latch may be realized by four transistors wherein each of the four transistors is connected to the nodes nZ and nZN so as to form a differential latch.

As can be seen from FIG. 4, the second differential latch 1410 comprises a high threshold voltage transistor. In particular, high threshold voltage transistors may be used for reducing leakage occurring in a sleep period. Specifically, the n-MOS transistors controlled by the signals at nodes nMN and nM, which are connected between nodes nZ and nZN and ground, are implemented as high threshold voltage transistors. During the sleep period with the interruptible power supply (VDDI) being shutdown, the signal at nodes nM and nMN is pulled to a low potential as already described with reference to FIG. 2. Accordingly, the n-MOS transistors controlled by the signals at nodes nMN and nM are set non-conductive, resulting in a reduced leakage current from the always-on power supply (VDDO) to ground.

In other words, during the sleep period the two n-MOS transistors controlled by the signals at nodes nMN and nM disconnect the nodes nZ and nZN and hence the retention latch from a rest of the slave storage element 1400, namely clocking transistors 1411 and 1412 and resetting means 1420, thereby retaining the data in the retention latch in a sleep period. Accordingly, the two n-MOS transistors controlled by the signals at nodes nMN and nM isolate the retention latch from the rest of the circuit in the sleep period.

Furthermore, during the sleep period with the interruptible power supply (VDDI) being shutdown, the p-MOS transistors controlled by the signals at nodes nMN and nM are both set to a conducting state so as to connect the always on power supply (VDDO) to the retention latch. Accordingly, irrespective of the state of clocking transistor 1413, the latching state in the retention latch is maintained.

Further, the second control means 1201, 1202 also comprise high threshold voltage transistors. Thereby, the storage state of the first differential latch 1310 is prevented from leaking in a non-sleep period, namely in the normal operation mode.

Additionally, the first control means 1110 are implemented using a low threshold voltage transistor in order to result in a high switching speed of the interruptible power supply (VDDI).

Further, the clocking transistors 1411 and 1412, provided in the second differential latch 1410, are implemented using low threshold voltage transistors in order to reduce the speed drawbacks of the other high threshold voltage transistor in the second differential latch 1410.

The latching state resetting means 1321, 1322, 1323 included in the master storage element 1300 are realized as low threshold voltage transistors.

The resetting operation is described by way of an example: the transistor 3123 included in the latching state resetting means 1321, 1322 and 1323 may perform the resetting operation of the latching state of the first differential latch 1310 to an initial state (predefined state) by draining the data stored at node nM to a low potential when a clear data signal is applied via signal node CDN. Additionally, in order to prevent current leaking during a resetting operation via transistor 1323 additional transistors 1321, 1322 are provided for disconnecting the respective side of the first differential latch from the interruptible power supply SWVDDI.

The latching state resetting means 1421 included in the slave storage element 1400 are realized by transistor 1421. In particular, the transistor 1421 is also provided as a low threshold voltage transistor. As the resetting operation performed by the latching state resetting means 1321, 1322 and 1323 may be performed in synchronization with the resetting operation performed by latching state resetting means 1421, there may be no need for disconnecting a respective side of the second differential latch 1410 from the power supply.

Figure 5:
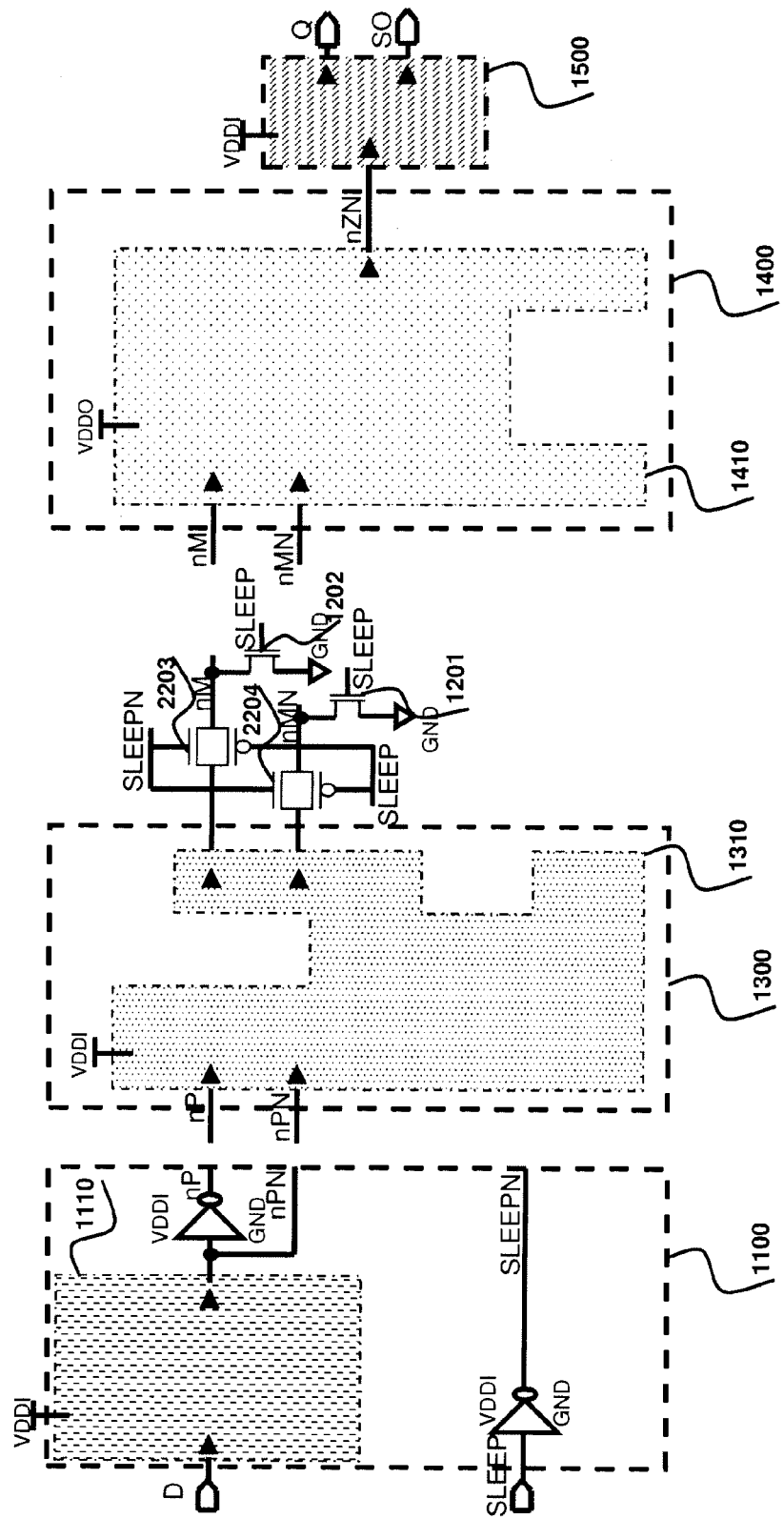
FIG. 5 illustrates a sleep mode of a master slave flip-flop according to another embodiment of the present invention.

With reference to FIG. 5, a sleep mode of a master slave flip-flop according to another embodiment of the present invention is illustrated.

In contrast to the embodiment illustrated by FIG. 2, FIG. 3 or FIG. 4, the embodiment illustrated by FIG. 5 employs a different mechanism for switching to a sleep mode. However, circuit elements, which are capable of performing the same functionality as described in the paragraphs relating to FIG. 2, FIG. 3 or FIG. 4, are indicated with the same reference numerals and the related description has been omitted.

In this embodiment, a first control means 1101 controlling power supplied by the interruptible power supply (VDDI) to the master storage element is omitted.

The first differential latch 1310 is provided with a connection to an interruptible power supply (VDDI) similar to the input stage and the output stage.

Furthermore, in order to prevent erroneous signal values from being transmitted from the master storage element 1300 to the slave storage element 1400, the connection between the master storage element 1300 and the slave storage element 1400 can be interrupted. In particular, pass gates 2203, 2204 are provided for electrically separating both sides of the connection, namely, the output nodes nM and nMN of the master storage element 1300 and the input nodes nM and nMN of the slave storage element 1400. The pass gates 2203 and 2204 may be realized employing high threshold voltage transistors.

Figure 6:
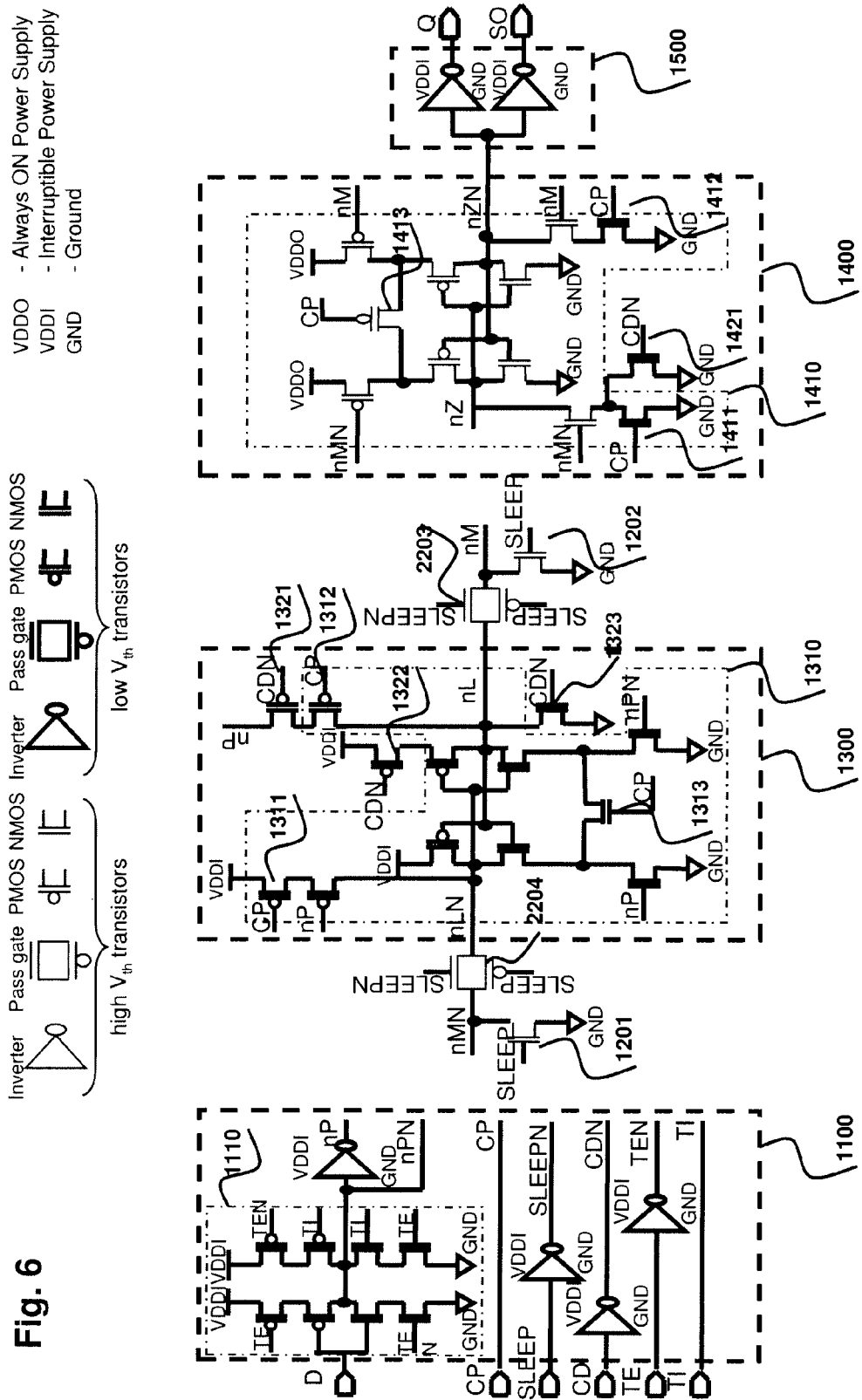
FIG. 6 shows an integrated circuit diagram of a master slave flip-flop according to another embodiment of the present invention.

Referring to FIG. 6, an integrated circuit diagram of a master slave flip-flop according to another embodiment of the present invention is shown. In particular, FIG. 6 shows an integrated circuit diagram of a master slave flip-flop employing the mechanism for switching to a sleep mode of FIG. 5. Circuit elements, which are capable of performing the same functionality as described in the paragraphs relating to FIG. 2, FIG. 3, FIG. 4 or FIG. 5, are indicated with the same reference numerals and the according description has been omitted.

The integrated circuit diagram of FIG. 6 shows pass gates 2203 and 2204 for interrupting the connection between the master storage element 1300 and the slave storage element 1400.

Additionally, the circuit diagram of the first differential latch 1310 of FIG. 6 differs from the embodiment shown in FIG. 4 by the omission of a first control means 1101. Accordingly, the circuit elements of the first differential latch 1310 are directly connected to the interruptible power supply (VDDI).

Additionally, FIG. 6 illustrates the modification of replacing the power supply connected to the transistor connected to signal nPN for controlling node nL by directly connecting the respective branch of the first differential latch 1310 to node nP, an output of the input stage 1100. Thereby, the number of transistors provided in the first differential latch 1310 may be reduced by one transistor to the total amount of ten transistors.

While the invention has been described with respect to preferred physical embodiments constructed in accordance therewith, it will be apparent to those skilled in the art that various modifications, variations and improvements of the present invention may be made in the light of the above teaching and within the preview of the appended claims without departing from the spirit of the intended scope of the invention. In addition, those areas, which it is believed that those of ordinary skill in the art are familiar with, have not been described herein in order to avoid unnecessarily obscuring the invention described herein. Accordingly, it is to be understood that the invention is not be limited to the specific illustrative embodiments, but only by the scope of the appended claims.

The invention claimed is:

1. A multi-threshold complementary metal-oxide semiconductor, MTCMOS, master slave flip-flop comprising:
  a master storage element comprising low threshold voltage transistors, said master storage element being configured to store an input data in response to a clock signal transition; and
  a slave storage element comprising high threshold voltage transistors, said slave storage element being configured to receive data from the master storage element and to output the received data in response to an opposite clock signal transition,
  wherein the master and the slave storage elements are provided with a single clock signal, and wherein the master storage element is coupled to an interruptible power supply and the slave storage element is coupled to an always ON power supply, such that the slave storage element is capable of retaining the received data.

2. The MTCMOS master slave flip-flop according to claim 1 wherein:
  the master storage element comprises a first conducting type transistor to be controlled by the single clock signal; and
  the slave storage element comprises a second conducting type transistor to be controlled by the single clock signal, such that the master storage element is capable to respond to a clock signal transition and the slave storage element is capable to respond to an opposite clock signal transition.

3. The MTCMOS master slave flip-flop according to claim 1 further comprising:
  a first control circuit configured to disconnect the interruptible power supply upon detecting a sleep signal; and
  a second control circuit configured to provide a predetermined potential to the connection between the master storage element and the slave storage element upon detecting the sleep signal.

4. The MTCMOS master slave flip-flop according to claim 3, wherein the slave storage element further comprises a retention latch configured to retain the received data and at least one high threshold voltage transistor configured to isolate the retention latch from the rest of the MTCMOS master slave flip-flop upon detecting the predetermined potential provided by the second control circuit.

5. The MTCMOS master slave flip-flop according to claim 3 wherein the second control circuit provides a low potential to the connection between master storage element and the slave storage element.

6. The MTCMOS master slave flip-flop according to claim 5 wherein the first control circuit comprises a low threshold voltage transistor and the second control circuit comprises a high threshold voltage transistor.

7. The MTCMOS master slave flip-flop according to claim 3 further comprising a pass gate capable of interrupting the connection between the master storage element and the slave storage element upon detecting the sleep signal.

8. The MTCMOS master slave flip-flop according to claim 1 wherein the master storage element comprises a first differential latch and the slave storage element comprises a second differential latch.

9. The MTCMOS master slave flip-flop according to claim 8 wherein the first differential latch is a static ratio-insensitive differential p-latch and the second differential latch is a static ratio-insensitive differential n-latch.

10. The MTCMOS master slave flip-flop according to claim 8 wherein the second differential latch comprises at least one clocking transistor with a low threshold voltage.

11. The MTCMOS master slave flip-flop according to claim 8 further comprising a latching state resetting circuit configured to reset the latching state of the first and of the second differential latch to a predetermined latching state.

12. The MTCMOS master slave flip-flop according to claim 11 wherein the latching state resetting circuit comprises a low threshold voltage transistor.

13. The MTCMOS master slave flip-flop according to claim 1 further comprising an input stage configured to control the input of data to the master storage element corresponding to a TE and/or a TI signal.

14. The MTCMOS master slave flip-flop according to claim 13 wherein the input stage is coupled to an interruptible power supply.

15. The MTCMOS master slave flip-flop according to claim 1 further comprising an output stage configured to convert the output signal of the slave storage element into a Q and/or a S0 signal.

16. The MTCMOS master slave flip-flop according to claim 15 wherein the output stage is coupled to an interruptible power supply.

17. A master slave flip-flop comprising:
a low threshold master storage element for storing input data in response to a transition of a single clock signal; and
a high threshold slave storage element for receiving data from the master storage element and to output the received data in response to an opposite transition of the single clock signal,
wherein the master storage element is coupled to an interruptible power supply and the slave storage element is coupled to an always ON power supply, such that the slave storage element is capable of retaining the received data.

18. The master slave flip-flop according to claim 17 wherein:
the master storage element comprises a cross-coupled latch.

19. The master slave flip-flop according to claim 17 wherein:
the slave storage element comprises a cross-coupled latch.

20. A multi-threshold complementary metal-oxide semiconductor, MTCMOS, master slave flip-flop comprising:
a master storage element comprising low threshold voltage transistors, said master storage element being configured to store an input data in response to a clock signal transition; and
a slave storage element comprising high threshold voltage transistors, said slave storage element being configured to receive data from the master storage element and to output the received data in response to an opposite clock signal transition,
wherein the master and the slave storage elements are provided with a single clock signal, wherein the master storage element comprises a first differential latch and the slave storage element comprises a second differential latch, and wherein the first differential latch is a static ratio-insensitive differential p-latch and the second differential latch is a static ratio-insensitive differential n-latch.

21. A multi-threshold complementary metal-oxide semiconductor, MTCMOS, master slave flip-flop comprising:
a master storage element comprising low threshold voltage transistors, said master storage element being configured to store an input data in response to a clock signal transition; and
a slave storage element comprising high threshold voltage transistors, said slave storage element being configured to receive data from the master storage element and to output the received data in response to an opposite clock signal transition,
wherein the master and the slave storage elements are provided with a single clock signal, wherein the master storage element comprises a first differential latch and the slave storage element comprises a second differential latch, and wherein the second differential latch comprises at least one clocking transistor with a low threshold voltage.

* * * * *